United States Patent
Glenn et al.

(10) Patent No.: US 6,571,466 B1
(45) Date of Patent: Jun. 3, 2003

(54) FLIP CHIP IMAGE SENSOR PACKAGE FABRICATION METHOD

(75) Inventors: Thomas P. Glenn, Gilbert, AZ (US); Steven Webster, Chandler, AZ (US); Roy Dale Hollaway, Paranaque Metro Manila (PH)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/536,830

(22) Filed: Mar. 27, 2000

(51) Int. Cl.[7] ................................................. H05K 3/30
(52) U.S. Cl. .............................. 29/841; 29/834; 29/837
(58) Field of Search .......................... 29/834, 837, 841; 174/52.2; 250/208.1; 257/724, 680, 687, 793, 788, 795; 438/64, 66, 67

(56) References Cited

U.S. PATENT DOCUMENTS

| | | | |
|---|---|---|---|
| 4,801,998 A | 1/1989 | Okuaki | 357/72 |
| 5,194,934 A | 3/1993 | Yamazaki et al. | |
| 5,222,014 A | 6/1993 | Lin | |
| 5,231,036 A | 7/1993 | Miyauchi et al. | |
| 5,463,229 A | 10/1995 | Takase et al. | |
| 5,578,525 A | 11/1996 | Mizukoshi | 437/206 |
| 5,579,207 A | 11/1996 | Hayden et al. | 361/790 |
| 5,786,589 A | 7/1998 | Segawa et al. | 250/208.1 |
| 5,821,532 A | 10/1998 | Beaman et al. | |
| 5,858,815 A | 1/1999 | Heo et al. | 438/112 |
| 5,867,368 A | 2/1999 | Glenn | |
| 5,907,151 A | 5/1999 | Gramann et al. | |
| 5,925,898 A | 7/1999 | Späth | 257/98 |
| 5,949,655 A | 9/1999 | Glenn | |
| 5,962,810 A | 10/1999 | Glenn | 174/52.2 |
| 5,973,337 A | 10/1999 | Knapp et al. | |
| 5,977,624 A | 11/1999 | Heo et al. | 257/701 |
| 6,005,965 A | 12/1999 | Tsuda et al. | 382/145 |
| 6,011,310 A | 1/2000 | Naito et al. | 257/774 |
| 6,028,354 A | 2/2000 | Hoffman | 257/706 |
| 6,046,070 A | 4/2000 | Shoji et al. | |
| 6,122,009 A | 9/2000 | Ueda | |
| 6,130,448 A | 10/2000 | Bauer et al. | |
| 6,143,981 A | 11/2000 | Glenn | |
| 6,144,507 A | 11/2000 | Hashimoto | 359/819 |
| 6,247,229 B1 | 6/2001 | Glenn | |
| 6,281,568 B1 | 8/2001 | Glenn et al. | |
| 6,291,884 B1 | 9/2001 | Glenn et al. | 257/747 |
| 6,342,406 B1 | 1/2002 | Glenn et al. | |
| 6,396,043 B1 | 5/2002 | Glenn et al. | 250/208.1 |
| 2001/0013653 A1 | 8/2001 | Shoji | 257/738 |
| 2002/0012234 A1 | 1/2002 | Harada et al. | 361/778 |

FOREIGN PATENT DOCUMENTS

JP 402278872 A 11/1990

OTHER PUBLICATIONS

Lapp et al., *New Substrate for Advanced Flat Panel Display Applications*, Product Information Sheet, 1994, 4 pages.
Corning Incorporated, *1737 Sheet Glass*, Product Information Sheet, revised 3/97, 2 pages.
Corning Incorporated, *Industrial Grade Products*, Product Information Sheet, revised 3/97, 2 pages.
Corning Incorporated, *Code: 1737F*, Material Information Sheet, issued 1/96, 5 pages.

(List continued on next page.)

Primary Examiner—Timothy V. Eley
(74) Attorney, Agent, or Firm—Gunnison, McKay & Hodgson, L.L.P.; Serge J. Hodgson

(57) ABSTRACT

A method of fabricating a flip chip image sensor package includes forming an aperture in a substrate and mounting an image sensor to the substrate. The image sensor is mounted such that an active area of the image sensor is aligned with the aperture. A bead is formed around a periphery of the image sensor. An aperture side of the aperture, the image sensor, and the bead define a pocket. The method further includes filling the pocket with a transparent liquid encapsulant and hardening the transparent liquid encapsulant. The hardened transparent liquid encapsulant serves as the window for the flip chip image sensor package.

20 Claims, 7 Drawing Sheets

OTHER PUBLICATIONS

Corning Incorporated, *Display Grade Products*, Product Information Sheet, revised 7/95, 4 pages.

Corning Incorporated, *Score Cutting of 7059F and 1737F Sheet Glasses*, Application Information Sheet, revised 4/96, 2 pages.

EE times, "Diminutive package holds Xicor E$^2$PROM", http://www.eetimes.com/news/98/1022news/xicor.html, Aug. 17, 1998.

Substrate Technologies Incorporated, "Glossary", pp. 1–3; http://www.sti–dallas.com/library/glossary.asp, Date not available.

Value Added Services, p. 1; http://www.valueaddedservices.net/glo.htm, Date not available.

Universal Instruments Corporation, Binghamton, New York 13902–0825, "Chip Scale Package Technology Wafer Scale Package Issues", http://www.uic.com/wcms/WCMS.nsf/index/White_Papers_7.html, Jul. 17, 2000.

FLIP CHIP IMAGE SENSOR PACKAGE FABRICATION METHOD

FIELD OF THE INVENTION

The present invention relates generally to the packaging of electronic components. More particularly, the present invention relates to a method of fabricating an image sensor package.

BACKGROUND OF THE INVENTION

Image sensors and assemblies are well known to those of skill in the art. In these assemblies, an image sensor was located within a housing, which supported a window. Radiation passed through the window and struck the image sensor, which responded to the radiation.

In the assembly, an image sensor was mounted to a printed circuit board. After the image sensor was mounted, the housing was mounted around the image sensor and to the printed circuit board. This housing provided a hermetic like barrier around the image sensor, while at the same time, supported the window above the image sensor.

As the art moves to smaller and lighter weight electronic devices, it becomes increasingly important that the size of the image sensor assembly used within these electronic devices is small. Disadvantageously, conventional image sensor assemblies required a housing to support the window and to hermetically seal the image sensor. However, these housings were relatively bulky and extend upwards from the printed circuit board a significant distance, e.g., 0.100 inches (2.54 mm) to 0.120 inches (3.05 mm) or more.

In addition, mounting these housings at the printed circuit board level was inherently labor intensive and made repair or replacement of the image sensor difficult. In particular, removal of the housing exposed the image sensor to the ambient environment. Since the image sensor was sensitive to dust as well as other environmental factors, it was important to make repairs or replacement of the image sensor in a controlled environment such as a cleanroom. Otherwise, there was a risk of damaging or destroying the image sensor. Since neither of these alternatives are desirable and both are expensive, the art needs an image sensor assembly which is simple to manufacture and service so that costs associated with the image sensor assembly are minimized.

In the event that moisture was trapped inside of the housing, defective operation or failure of the image sensor assembly was observed. More particularly, the moisture had a tendency to condense within the housing and on the interior surface of the window. Even if the housing later dried out, a stain was left on the window. In either event, electromagnetic radiation passing through the window was distorted or obstructed by either moisture condensation or stain, which resulted in defective operation or failure of the image sensor assembly.

For this reason, an important characteristic was the temperature at which condensation formed within the housing of image sensor assembly, i.e., the dew point of the image sensor assembly. In particular, it was important to have a low dew point to insure satisfactory performance of the image sensor assembly over a broad range of temperatures.

SUMMARY OF THE INVENTION

In accordance with the present invention, an image sensor package includes an image sensor having an active area, which is responsive to radiation. The image sensor is mounted to a substrate, which is transparent to the radiation. The image sensor is mounted such that the active area of the image sensor faces the substrate.

During use, radiation is directed at the substrate. This radiation passes through the substrate and strikes the active area of the image sensor. The image sensor responds to the radiation in a conventional manner.

Of importance, the substrate serves a dual function. In particular, the substrate is the window which covers the active area of the image sensor. Further, the substrate is the platform upon which the image sensor package is fabricated.

Recall that in the prior art, a housing was used to support the window above the image sensor. These housings were typically formed of ceramic, which is relatively expensive. Advantageously, an image sensor package in accordance with the present invention eliminates the need for a housing of the prior art. Accordingly, the image sensor package is significantly less expensive to manufacture than image sensor assemblies of the prior art.

In one embodiment, a bead is formed around a periphery of the image sensor such that the image sensor, the bead, and the substrate form a sealed cavity. The active area of the image sensor is located and hermetically sealed within this cavity. Hermetically sealing the active area reduces complexity and cost in the event the image sensor must be repaired or replaced compared to the prior art.

Recall that in the prior art, the housing, which hermetically sealed the image sensor, was mounted directly to the larger substrate. Thus, removal of the housing necessarily exposed the image sensor to the ambient environment and to dust. For this reason, the image sensor had to be repaired or replaced in a cleanroom or else there was a risk of damaging or destroying the image sensor.

In contrast, the active area is hermetically sealed as part of the image sensor package. The image sensor package is mounted to the larger substrate. To repair or replace the image sensor, the image sensor package is simply removed and a new image sensor package is mounted to the larger substrate. At no time is the active area exposed to the ambient environment during this procedure. Advantageously, this procedure can be performed in any facility with or without a cleanroom. The old image sensor package is discarded or shipped to a central facility for repair. Since the image sensor package is simple to manufacture and service, the cost associated with the image sensor package are minimized compared to the prior art.

Further, the image sensor package is relatively thin compared to prior art image sensor assemblies. In particular, by mounting the image sensor directly to the substrate, which also serves as the window for the image sensor, the resulting thickness of the image sensor package is relatively small, e.g., is 0.99 millimeters (mm). Recall that in the prior art, the image sensor was mounted directly to the larger substrate and a housing was used to support a window above the image sensor. This housing extended a significant distance, e.g., 0.100 inches (2.54 mm) to 0.120 inches (3.05 mm) or more, from the larger substrate. Since the image sensor package in accordance with the present invention is relatively thin compared to an image sensor assembly of the prior art, the image sensor package is well suited for use with miniature lightweight electronic devices, which require thin and lightweight image sensor assemblies.

In another embodiment, a step up ring is used to elevate interconnection balls above the image sensor, the interconnection balls being used to connect the image sensor package to a larger substrate such as a printed circuit mother board. Advantageously, use of the step up ring allows the interconnection balls to have minimum size and pitch. This may be important, for example, when a large number of interconnection balls must be provided in a limited area.

In one embodiment, a plurality of image sensor packages are fabricated simultaneously to minimize the cost associated with each individual image sensor package. In accordance with this embodiment, image sensors are attached to an array type substrate, which includes a plurality of individual substrates integrally connected together. Beads are formed around the peripheries of the image sensors. The array type substrate is then singulated, either before or after the array type substrate is populated with interconnection balls or other interconnection structures.

By forming a plurality of image sensor packages simultaneously, several advantages are realized. One advantage is that it is less labor intensive to handle and process a plurality of image sensor packages simultaneously rather than to handle and process each image sensor package on an individual basis. By reducing labor, the cost associated with each package is minimized.

In accordance with another embodiment of the present invention, an image sensor package includes a substrate having an aperture. The aperture is defined by an aperture side. The image sensor package further includes an image sensor having an active area aligned with the aperture. A window is in contact with the aperture side. In one embodiment, the window is formed of a hardened transparent liquid encapsulant.

Advantageously, by forming the window with a low refractive index, the sensitivity of the image sensor package is improved compared to the prior art. Recall that in the prior art, a housing was mounted around the image sensor and to the print circuit board. This housing supported a window above the image sensor. However, located between the window and the image sensor was air. Disadvantageously, air has a relatively low refractive index compared to the window. As those skilled in the art understand, as visible light or other electromagnetic radiation passes from a material having a high refractive index to a material having a low refractive index and vice versa, a significant percentage of the electromagnetic radiation is reflected.

Since the electromagnetic radiation had to pass from air, through the window, and back through air to reach the active area of the image sensor in the prior art, a significant percentage of the electromagnetic radiation was reflected. In particular, the electromagnetic radiation had to pass through three interfaces: (1) the air/window interface; (2) the window/air interface; and (3) the air/active area interface. This resulted in an overall loss of sensitivity of prior art image sensor assemblies.

However, in the image sensor package in accordance with this embodiment, radiation passes from air, through the window, and reaches the active area. Accordingly, the radiation passes through only two interfaces: (1) the air/window interface; and (2) the window/active area interface. By minimizing the number of interfaces, the amount of reflected radiation is also minimized. Accordingly, the amount of reflected radiation is reduced compared to the prior art. This improves the sensitivity of the image sensor package compared to prior art image sensor assemblies.

Further, instead of having air between the window and the active area of the image sensor as in the prior art, the window completely fills the region between the ambient environment and the active area. Advantageously, by eliminating the prior art cavity between the active area and the window, the possibility of moisture condensation within the cavity is also eliminated. Accordingly, the image sensor package does not have a dew point.

In contrast, prior art image sensor assemblies had a dew point, i.e., a temperature at which condensation formed within the housing, which enclosed the image sensor and supported the window. Disadvantageously, this limited the temperature range over which the image sensor assembly would satisfactorily perform. Alternatively, the image sensor assembly was fabricated in a low humidity environment to avoid trapping moisture within the housing and was hermetically sealed by the housing to keep out moisture. This added complexity, which increased the cost of the image sensor assembly. Further, in the event that the hermetic seal of the housing failed, the image sensor was damaged or destroyed.

Since the image sensor package in accordance with this embodiment does not have a dew point, the image sensor package operates satisfactorily over a broader range of temperatures than image sensor assemblies of the prior art. Further, since the image sensor package is formed without a cavity, there is no possibility that moisture will leak into the image sensor package. Accordingly, the reliability of the image sensor package is greater than that of the prior art.

The window also relieves stress on the bumps between the bond pads of the image sensor and the traces on the substrate. In particular, to the extent that the image sensor has a different thermal coefficient expansion than the substrate, the window insures that the image sensor does not become dismounted from the substrate as a result of differential thermal expansion. By minimizing the possibility of failure of the bumps, the window insures the reliability of the image sensor package.

Advantageously, by mounting the image sensor to the substrate as a flip chip, the image sensor is positionally aligned to within tight tolerances. More particularly, since the bond pads of the image sensor are connected to the traces on the substrate, the image sensor is inherently aligned to the traces. Further, since the interconnection balls are formed on these same traces, the interconnection balls are inherently aligned to the traces. As a result, the image sensor is precisely aligned to the interconnection balls. By precisely aligning the image sensor, the performance of the image sensor package is improved compared to a conventional image sensor assembly in which bond pads were wirebonded to traces.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
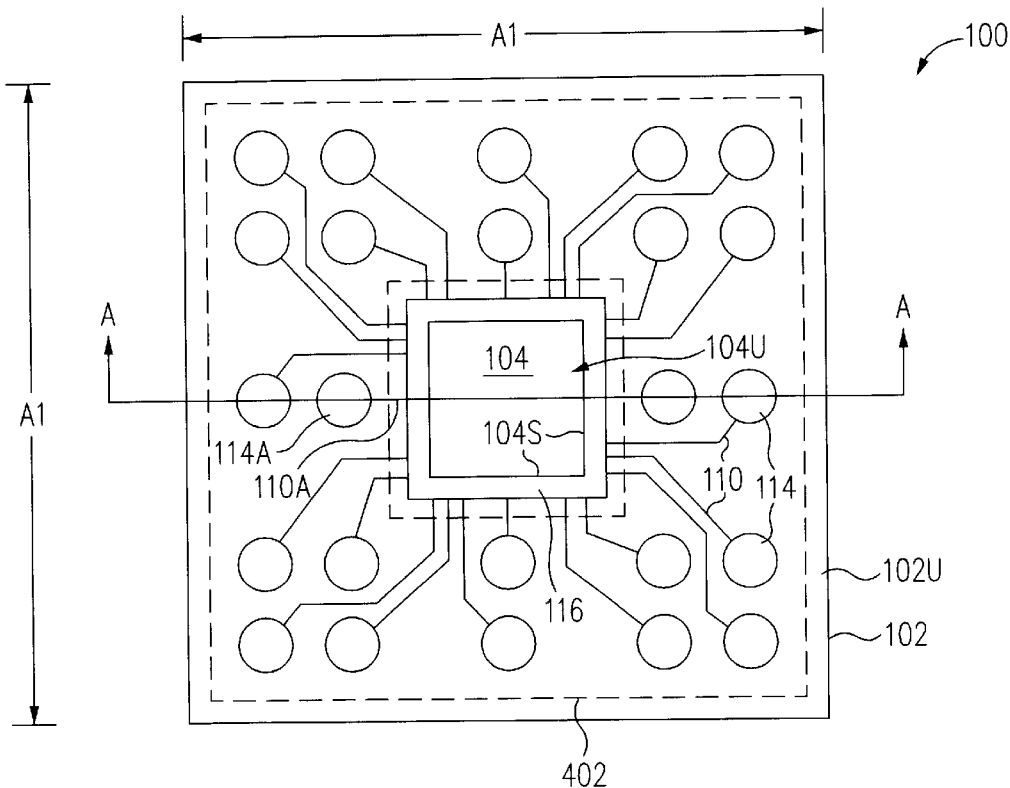
FIG. 1 is a top plan view of an image sensor package in accordance with the present invention.

In accordance with the present invention, an image sensor package 100 (FIGS. 1, 2) includes an image sensor 104 having an active area 106, which is responsive to radiation. Image sensor 104 is mounted to a substrate 102, which is transparent to the radiation. Image sensor 104 is mounted such that active area 106 of image sensor 104 faces substrate 102.

During use, radiation is directed at substrate 102. This radiation passes through substrate 102 and strikes active area 106 of image sensor 104. Image sensor 104 responds to the radiation as is well known to those of skill in the art.

Of importance, substrate 102 serves a dual function. In particular, substrate 102 is the window which covers active area 106 of image sensor 104. Further, substrate 102 is the platform upon which image sensor package 100 is fabricated.

Recall that in the prior art, a housing was used to support the window above the image sensor. These housings were typically formed of ceramic, which is relatively expensive. Advantageously, image sensor package 100 in accordance with the present invention eliminates the need for a housing of the prior art. Accordingly, image sensor package 100 is significantly less expensive to manufacture than image sensor assemblies of the prior art.

In one embodiment, a bead 116 is formed around a periphery of image sensor 104 such that image sensor 104, bead 116, and substrate 102 form a sealed cavity 118. Active area 106 of image sensor 104 is located and hermetically sealed within cavity 118. Hermetically sealing active area 106 reduces complexity and cost in the event image sensor 104 must be repaired or replaced compared to the prior art.

Recall that in the prior art, the housing, which hermetically sealed the image sensor, was mounted directly to the larger substrate. Thus, removal of the housing necessarily exposed the image sensor to the ambient environment and to dust. For this reason, the image sensor had to be repaired or replaced in a cleanroom or else there was a risk of damaging or destroying the image sensor.

In contrast, active area 106 is hermetically sealed as part of image sensor package 100. Image sensor package 100 is mounted to the larger substrate, for example, by reflowing interconnection balls 114. To repair or replace image sensor 104, image sensor package 100 is simply removed and a new image sensor package 100 is mounted to the larger substrate. At no time is active area 106 exposed to the ambient environment during this procedure. Advantageously, this procedure can be performed in any facility with or without a cleanroom. The old image sensor package 100 is discarded or shipped to a central facility for repair. Since image sensor package 100 is simple to manufacture and service, the cost associated with image sensor package 100 are minimized compared to the prior art.

Further, image sensor package 100 is relatively thin compared to prior art image sensor assemblies. In particular, by mounting image sensor 104 directly to substrate 102, which also serves as the window for image sensor 104, the resulting thickness of image sensor package 100 is relatively small, e.g. is 0.99 millimeters (mm). Recall that in the prior art, the image sensor was mounted directly to the larger substrate and a housing was used to support a window above the image sensor. This housing extended a significant distance, e.g., 0.100 inches (2.54 mm) to 0.120 inches (3.05 mm) or more, from the larger substrate. Since image sensor package 100 in accordance with the present invention is relatively thin compared to an image sensor assembly of the prior art, image sensor package 100 is well suited for use with miniature lightweight electronic devices, which require thin and lightweight image sensor assemblies.

In another embodiment, a step up ring 402 (FIG. 4) is used to elevate interconnection balls 114-1 above image sensor 104, interconnection balls 114-1 being used to connect image sensor package 400 to a larger substrate such as a printed circuit mother board. Advantageously, use of step up ring 402 allows interconnection balls 114-1 to have minimum size and pitch. This may be important, for example, when a large number of interconnection balls 114-1 must be provided in a limited area.

In one embodiment, a plurality of image sensor packages 100 are fabricated simultaneously to minimize the cost associated with each individual image sensor package 100. In accordance with this embodiment, image sensors 104 are attached to an array type substrate 602 (FIG. 6), which includes a plurality of individual substrates 102 integrally connected together. Beads 116 (FIG. 7) are formed around the peripheries of image sensors 104. Array type substrate 602 is then singulated, either before (FIG. 7) or after (FIG. 8) array type substrate 602 is populated with interconnection balls 114.

By forming a plurality of image sensor packages 100 simultaneously, several advantages are realized. One advantage is that it is less labor intensive to handle and process a plurality of image sensor packages 100 simultaneously rather than to handle and process each image sensor package 100 on an individual basis. By reducing labor, the cost associated with each package is minimized.

In accordance with another embodiment of the present invention (FIGS. 9 and 10), an image sensor package 1000 includes a substrate 1002 having an aperture 1004. Aperture 1004 is defined by an aperture side 1004S. Image sensor package 1000 further includes an image sensor 104 having an active area 106 aligned with aperture 1004. A window 1012 is in contact with aperture side 1004S. In one embodiment, window 1012 is formed of a hardened transparent liquid encapsulant.

Advantageously, by forming window 1012 with a low refractive index, the sensitivity of image sensor package 1000 is improved compared to the prior art. Recall that in the prior art, a housing was mounted around the image sensor and to the print circuit board. This housing supported a window above the image sensor. However, located between the window and the image sensor was air. Disadvantageously, air has a relatively low refractive index compared to the window. As those skilled in the art understand, as visible light or other electromagnetic radiation passes from a material having a high refractive index to a material having a low refractive index and vice versa, a significant percentage of the electromagnetic radiation is reflected.

Since the electromagnetic radiation had to pass from air, through the window, and back through air to reach the active area of the image sensor in the prior art, a significant percentage of the electromagnetic radiation was reflected. In particular, the electromagnetic radiation had to pass through three interfaces: (1) the air/window interface; (2) the window/air interface; and (3) the air/active area interface. This resulted in an overall loss of sensitivity of prior art image sensor assemblies.

However, in image sensor package 1000, radiation passes from air, through window 1012, and reaches active area 106. Accordingly, the radiation passes through only two interfaces: (1) air/window 1012 interface; and (2) window 1012/active area 106 interface. By minimizing the number of interfaces, the amount of reflected radiation is also minimized. Accordingly, the amount of reflected radiation is reduced compared to the prior art. This improves the sensitivity of image sensor package 1000 compared to prior art image sensor assemblies.

Further, instead of having air between the window and the active area of the image sensor as in the prior art, window 1012 completely fills the region between the ambient environment and active area 106. Advantageously, by eliminating the prior art cavity between the active area and the window, the possibility of moisture condensation within the cavity is also eliminated. Accordingly, image sensor package 1000 does not have a dew point.

In contrast, prior art image sensor assemblies had a dew point, i.e., a temperature at which condensation formed within the housing, which enclosed the image sensor and supported the window. Disadvantageously, this limited the temperature range over which the image sensor assembly would satisfactorily perform. Alternatively, the image sensor assembly was fabricated in a low humidity environment to avoid trapping moisture within the housing and was hermetically sealed by the housing to keep out moisture. This added complexity, which increased the cost of the image sensor assembly. Further, in the event that the hermetic seal of the housing failed, the image sensor was damaged or destroyed.

Since image sensor package 1000 does not have a dew point, image sensor package 1000 operates satisfactorily over a broader range of temperatures than image sensor assemblies of the prior art. Further, since image sensor package 1000 is formed without a cavity, there is no possibility that moisture will leak into image sensor package 1000. Accordingly, the reliability of image sensor package 1000 is greater than that of the prior art.

Window 1012 also relieves stress on bumps 112. In particular, to the extent that image sensor 104 has a different thermal coefficient expansion than substrate 1002, window 1012 in combination with bead 116-2 insures that image sensor 104 does not become dismounted from substrate 1002 as a result of differential thermal expansion. By minimizing the possibility of failure of bumps 112, window 1012 further insures the reliability of image sensor package 1000.

Advantageously, by mounting image sensor 104 to substrate 1002 as a flip chip, image sensor 104 is positionally aligned to within tight tolerances. More particularly, since bond pads 108 of image sensor 104 are connected to traces 110 on substrate 1002, image sensor 104 is inherently aligned to traces 110. Further, since interconnection balls 114 are formed on these same traces 110, interconnection balls 114 are inherently aligned to traces 110. As a result, image sensor 104 is aligned to interconnection balls 114 to within tight tolerance. By precisely aligning image sensor 104, the performance of image sensor package 1000 is improved compared to a conventional image sensor assembly in which bond pads were wirebonded to traces.

Figure 2:
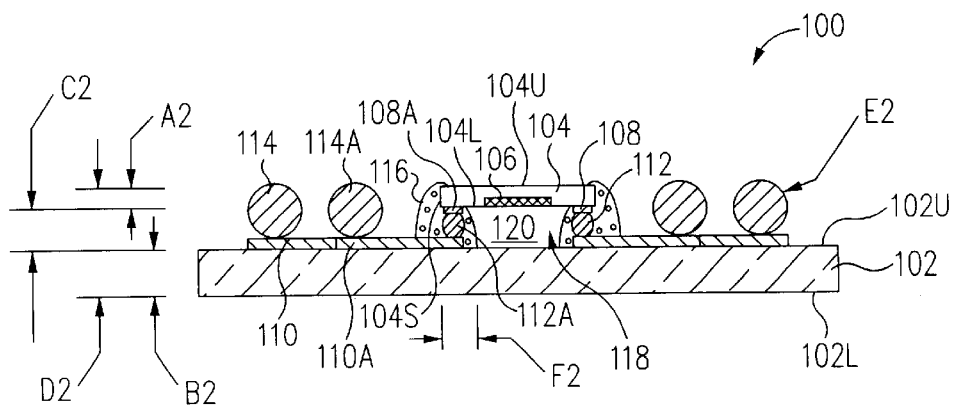
FIG. 2 is a cross-sectional view of the package along the line A—A of FIG. 1 in accordance with one embodiment of the present invention.

More particularly, FIG. 1 is a top plan view of an image sensor package 100 (hereinafter package 100) in accordance with the present invention. FIG. 2 is a cross-sectional view of package 100 along the line A—A of FIG. 1 in accordance with one embodiment of the present invention.

Referring to FIGS. 1 and 2 together, package 100 includes a substrate 102 and an image sensor 104 mounted to substrate 102. Image sensor 104 includes an active area 106 on a lower, e.g., first, surface 104L of image sensor 104, which faces towards substrate 102. Generally, active area 106 is responsive to radiation, e.g., electromagnetic radiation, as is well known to those of skill in the art. For example, active area 106 is responsive to infrared radiation, ultraviolet light, and/or visible light. Illustratively, image sensor 104 is a CMOS image sensor device, a charge coupled device (CCD), a pyroelectric ceramic on CMOS device, or an erasable programmable read-only memory device (EPROM) although other image sensors are used in other embodiments.

Generally, substrate 102 is transparent to the radiation of interest, e.g., to the radiation to which active area 106 of image sensor 104 is responsive, as those of skill in the art will understand. Generally, the transmittance of substrate 102 is sufficient to allow the necessary minimum amount of radiation needed for the proper operation of image sensor 104 to pass through substrate 102. In one particular embodiment, substrate 102 has a transmittance of approximate 92 percent for electromagnetic radiation having a wavelength in the range of 500 nm to 2200 nm. During use, radiation passes through substrate 102, through medium 120 and strikes active area 106.

In this embodiment, substrate 102 is integral, i.e., is a single piece and not a plurality of pieces connected together. For example, substrate 102 is optical glass, germanium or silicon but can be formed of other materials depending upon the application. In one particular example, substrate 102 is fusion formed 1737 glass composition, designated as 1737F, supplied by Corning Inc. of Corning, N.Y. For a detailed description see: (1) "material information" sheet for "code: 1737F" issued 1/96, 5 pages total; (2) "product information" sheet for "display grade products", revised 7/95, 4 pages total; and (3) "product information" sheet for "industrial grade products", revised 3/97, 2 pages total, which are all by Corning Inc., Advanced Display Products, Corning, N.Y., 14831, which are all herein incorporated by reference in their entireties.

In one embodiment, substrate 102 includes one or more coatings on a lower, e.g., first, surface 102L of substrate 102. This coating(s) can act as a filter such as an infrared filter, or can be and anti-reflection coating, although in other embodiments, substrate 102 does not include a coating. Substrate 102 is typically planar and has no optical power, although in one embodiment, substrate 102 has optical power, e.g., is a lens. Illustratively, substrate 102 is square and dimension Al (FIG. 1) is 152.0 mm, 101.6 mm, 50.8 mm or 11.67 mm.

Image sensor 104 further includes a plurality of bond pads 108 on lower surface 104L of image sensor 104. Bond pads 108 are connected to the internal circuitry of image sensor 104.

Formed on an upper, e.g., second, surface 102U opposite lower surface 102L of substrate 102 are a plurality of electrically conductive traces 110 which include a first trace 11A. Substrate 102 is an electrical insulator or includes an electrically insulating layer on upper surface 102U. Generally, traces 110 have excellent adhesion to substrate 102 and do not react with, corrode, or otherwise degrade substrate 102. Traces 110 are formed using conventional techniques such as through evaporation, screening and/or plating of an electrically conductive material on substrate 102. Generally, a conductive layer is deposited and patterned or a conductive layer is selectively deposited.

In one embodiment, traces 110 include evaporated aluminum, gold, indium, palladium, nickel, platinum, tungsten and/or silver and/or a combination thereof. In another embodiment, traces 110 are a thick film metallization which includes gold, gold plated indium, nickel plated indium, gold plated nickel plated indium, platinum silver, palladium silver, indium, gold plated nickel plated tungsten, silver and/or tungsten and/or a combination thereof. However, in light of this disclosure, those of skill in the art will understand that traces 110 can be formed of other materials and/or using other techniques.

Bond pads 108 are electrically connected to corresponding traces 110 by electrically conductive bumps 112. In one embodiment, bond pads 108 are aluminum and, optionally, plated gold on the aluminum, and electrically conductive bumps 112 are: (1) stud bumps, i.e., gold balls; (2) electrically conductive epoxy paste; or (3) electrically conductive epoxy film as are well known to those of skill in the art. In an alternative embodiment, bond pads 108 are gold on nickel on tungsten or gold on nickel on chrome and are electrically connected to traces 110 using a conventional flip chip process, e.g., with solder. In another embodiment, bond pads 108 are: (1) aluminum; (2) plated nickel vanadium on the aluminum; (3) plated copper on the nickel vanadium; and (4) optionally, plated solder on the copper and electrically conductive bumps 112 are solder. In yet another embodiment, bond pads 108 are: (1) aluminum; (2) plated titanium tungsten on the aluminum; (3) plated copper on the titanium tungsten; and (4) optionally, plated solder on the copper and electrically conductive bumps 112 are solder.

Formed on and electrically connected to traces 110 are corresponding electrically conductive interconnection balls 114 such solder balls. Interconnection balls 114 are used to electrically connect package 100 to a larger substrate (not shown) such as a printed circuit mother board.

To illustrate, a first bond pad 108A of the plurality of bond pads 108 of image sensor 104 is electrically connected to first trace 110A of the plurality of traces 110 by a first bump 112A of the plurality of bumps 112. First trace 110A is electrically connected to a first interconnection ball 114A of the plurality of interconnection balls 114.

As set forth above, an electrically conductive pathway between bond pad 108A and interconnection ball 114A is formed by bump 112A and trace 110A. The other bond pads 108, traces 110, bumps 112, and interconnection balls 114 are electrically connected to one another in a similar fashion so are not discussed further to avoid detracting from the principals of the invention.

Although a particular electrically conductive pathway between bond pad 108A and interconnection ball 114A is described above, in light of this disclosure, it is understood that other electrically conductive pathways can be formed. For example, instead of direct electrical connections between bond pads 108 and bumps 112, between bumps 112 and traces 110, and between traces 110 and interconnection balls 114, contact metallizations are interposed between the items.

Further, it is understood that the number of bond pads 108, bumps 112, traces 110, and interconnection balls 114 used depends upon the particular input/output requirements of image sensor 104. In addition, interconnection balls 114 are distributed in a variety of formats, e.g., in an array format to form a ball grid array package.

A bead 116 contacts the periphery of image sensor 104 and secures the periphery of image sensor 104 to substrate 102. Generally, bead 116 contacts sides 104S of image sensor 104 and upper surface 102U of substrate 102. Typically, bead 116 is an electrical insulator. In one embodiment, bead 116 extends slightly under image sensor 104 and contacts the periphery of lower surface 104L, for example, extends inwards from sides 104S by 0.15±0.05 mm (i.e., dimension F2 of FIG. 2 is 0.15±0.05 mm). In other embodiments, bead 116 extends over image sensor 104 and contacts the periphery of an upper, e.g., second, surface 104U opposite lower surface 104L of image sensor 104 or, alternatively, entirely contacts upper surface 104U.

To the extent that image sensor 104 has a different thermal coefficient of expansion than substrate 102, bead 116 insures that image sensor 104 does not become dismounted from substrate 102 as a result of differential thermal expansion between image sensor 104 and substrate 102.

Further, bead 116 forms a seal between the periphery of image sensor 104 and substrate 102. Thus, image sensor 104, bead 116, and substrate 102 define a cavity 118, which is sealed. In particular, active area 106 is located within cavity 118, which is sealed to protect active area 106 against external moisture, dust and contamination. In one embodiment, bead 116 is an epoxy dispense material such as Hysol 4323.

Generally, cavity 118 contains a medium 120, which is transparent to the radiation of interest, e.g., to the radiation to which active area 106 of image sensor 104 is responsive. For example, if the radiation of interest is visible light, medium 120 should have a low refractive index so that medium 120 will not reduce the effectiveness of detector cells such as color or μ-lens fitted detector cells within active area 106. Further, medium 120 should be free from physical defects, which may cause point defects in a received spatial light pattern. In one embodiment, medium 120 is air.

To use package 100, package 100 is mounted to a larger substrate such as a printed circuit mother board. Package 100 is mounted using conventional techniques such as by re-flowing interconnection balls 114. Once mounted, lower surface 102L of substrate 102 faces away from the larger substrate and is exposed.

Radiation is directed at and strikes lower surface 102L of substrate 102. This radiation passes through substrate 102, through medium 120 and strikes active area 106. Image sensor 104 responds to this radiation as is well known to those of skill in the art.

However, in an alternative embodiment, active area 106 of image sensor 104 transmits radiation such as electromagnetic radiation. For example, image sensor 104 is a light emitting diode (LED) micro-display. In accordance with this embodiment, radiation transmitted by active area 106 passes through medium 120, through substrate 102, and emanates from package 100. For simplicity, in the above and following discussions, active area 106 as a receiver of radiation is set forth. However, in light of this disclosure, those of skill in the art will recognize that generally active area 106 can be a receiver of radiation, a transmitter of radiation, 720 or a transceiver, i.e., a transmitter and a receiver, of radiation.

Of importance, substrate 102 serves a dual function. In particular, substrate 102 is the window which covers active area 106 of image sensor 104. Further, substrate 102 is the platform upon which package 100 is fabricated.

Recall that in the prior art, a housing was used to support the window above the image sensor. These housings were typically formed of ceramic, which was relatively expensive. Advantageously, package 100 in accordance with the present invention eliminates the need for a housing of the prior art. Accordingly, package 100 is significantly less expensive to manufacture than image sensor assemblies of the prior art.

Further, active area 106 of image sensor 104 is hermetically sealed in cavity 118, and in particular, is hermetically sealed by the combination of image sensor 104, bead 116, and substrate 102. Hermetically sealing active area 106 in accordance with the present invention reduces complexity and cost in the event image sensor 104 must be repaired or replaced compared to the prior art.

Recall that in the prior art, the housing, which hermetically sealed the image sensor, was mounted directly to the larger substrate. Thus, removal of the housing necessarily exposed the image sensor to the ambient environment and to dust. For this reason, the image sensor had to be repaired or replaced in a cleanroom or else there was a risk of damaging or destroying the image sensor.

In contrast, active area 106 is hermetically sealed as part of package 100. Package 100 is mounted to the larger substrate, for example, by reflowing interconnection balls 114. To repair or replace image sensor 104, package 100 is simply removed and a new package 100 is mounted to the larger substrate. At no time is active area 106 exposed to the ambient environment during this procedure. Advantageously, this procedure can be performed in any facility with or without a cleanroom. The old package 100 is discarded or shipped to a central facility for repair. Since package 100 is simple to manufacture and service, the cost associated with package 100 are minimized compared to the prior art.

Further, package 100 is relatively thin compared to prior art image sensor assemblies. In particular, by mounting image sensor 104 directly to substrate 102, which also serves as the window for image sensor 104, the resulting thickness of package 100 is relatively small, e.g., is 0.99 mm. Recall that in the prior art, the image sensor was mounted directly to the larger substrate and a housing was used to support a window above the image sensor. This housing extended a significant distance, e.g., 0.100 inches (2.54 mm) to 0.120 inches (3.05 mm) or more, from the larger substrate. Since package 100 in accordance to the present invention is relatively thin compared to an image sensor assembly of the prior art, package 100 is well suited for use with miniature lightweight electronic devices, which require thin and lightweight image sensor assemblies.

Illustrative specifications for the various characteristics illustrated in FIG. 2 are set forth below in Table 1.

TABLE 1

| Characteristic | Description | Specification |
|---|---|---|
| A2 | image sensor thickness | 0.66 ± 0.10 mm, e.g., 0.71 mm |
| B2 | substrate thickness | 0.41 to 0.66 mm, e.g., 0.61 mm |
| C2 | bump thickness | 0.08 to 0.13 mm, e.g., 0.10 mm |
| D2 | overall thickness of mounted image sensor and substrate | 1.05 to 1.55 mm, e.g., 1.42 mm |
| E2 | ball size and pitch | 1.01 mm dia on 1.50 mm center |

To further reduce the thickness of package 100, in one embodiment, image sensor 104 is back lapped, i.e., upper surface 104U is ground down typically while image sensor 104 is still in wafer form so that upper surface 104U is a grinded surface. By reducing the thickness of image sensor 104, the minimum allowable size of interconnection balls 114 is also reduced.

Generally, interconnection balls 114 must be of a sufficient size to achieve a required system level clearance between the larger substrate and upper surface 104U of image sensor 104 after package 100 is mounted to the larger substrate. In particular, interconnection balls 114 extend above upper surface 102U of substrate 102 to a greater height than the height of upper surface 104U of image sensor 104 above upper surface 102U of substrate 102.

Illustrative specifications for the various characteristics illustrated in FIG. 2 for a package 100 having a back lapped image sensor 104 are set forth below in Table 2.

TABLE 2

| Characteristic | Description | Specification |
|---|---|---|
| A2 | image sensor thickness | 0.28 mm |
| B2 | substrate thickness | 0.41 to 0.66 mm, e.g., 0.61 mm |
| C2 | bump thickness | 0.08 to 0.13 mm, e.g., 0.10 mm |
| D2 | overall thickness of mounted image sensor and substrate | 0.77 to 1.07 mm, e.g., 0.99 mm |
| E2 | ball size and pitch | 0.76 mm dia on 1.27 mm center |

In an alternative embodiment, the height of interconnection balls 114 is less than the height of image sensor 104. More particularly, interconnection balls 114 extend above upper surface 102U of substrate 102 to a lesser height than the height of upper surface 104U of image sensor 104 above upper surface 102U of substrate 102. Generally, a wide variety of interconnection balls 114, having a wide variety of pitches can be used, for example, interconnection balls having a diameter in the range of 0.20 mm to 0.76 mm and a pitch in the range of 1.27 mm to 0.4 mm, e.g., 1.27 mm, 1.0 mm, 0.8 mm, 0.5 mm, or 0.4 mm are used. Alternatively, electrically conductive interconnection pads (not shown) are formed instead of interconnection balls 114, e.g., to form a land grid array (LGA) style package, as those of skill in the art will understand.

In the event that the height of interconnection balls 114 is less than the height of image sensor 104 (or interconnection balls 114 are not formed), the larger substrate to which package 100 is mounted is provided with: (1) a protruding interconnection structure, e.g., solder balls, which form the electrical interconnections with traces 110; and/or (2) an aperture into which image sensor 104 is fitted.

Figure 3:
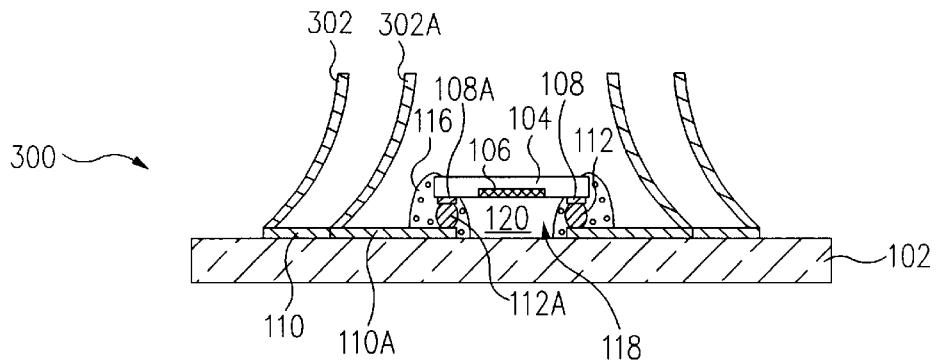
FIG. 3 is a cross-sectional view of an image sensor package in accordance with an alternative embodiment of the present invention.

In an alternative embodiment, instead of having interconnection balls 114, flexible conductors are used. FIG. 3 is a cross-sectional view of image sensor package 300 in accordance with this embodiment of the present invention.

As shown in FIG. 3, flexible conductors 302 are electrically connected to corresponding traces 110. To illustrate, a first flexible conductors 302A of the plurality of flexible conductors 302 is electrically connected to trace 110A. The other flexible conductors 302 are electrically connected to the other corresponding traces 110 in a similar manner. Flexible conductors 302 are electrically connected to corresponding traces 110 using solder reflow, electrically conductive adhesive, and/or another suitable technique.

Flexible conductors 302 provide greater freedom in the location of package 300 with respect to the larger substrate. Further, in the event image sensor 104 is relatively thick and would otherwise require relatively large interconnection balls 114 (interconnection balls 114 are illustrated in FIGS. 1 and 2), flexible conductors 302 are well suited for use.

In yet another alternative embodiment, a step up ring is used to elevate interconnection balls above image sensor 104 as discussed further below in reference to FIG. 4. Elevating interconnection balls, and more generally an interconnection structure, is important when image sensor 104 is relatively thick, e.g., is greater than 0.014 inches (0.356 mm), and would otherwise require relatively large interconnection balls 114.

Figure 4:
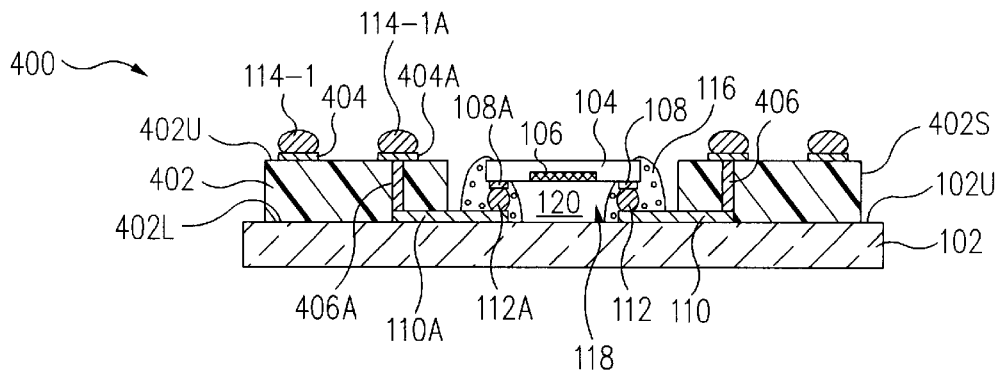
FIG. 4 is a cross-sectional view of an image sensor package along the line A—A of FIG. 1 in accordance with another alternative embodiment of the present invention.

FIG. 4 is a cross-sectional view of an image sensor package 400 along the line A—A of FIG. 1 in accordance with an alternative embodiment of the present invention. As shown in FIG. 1 (in dashed lines) and in FIG. 4, a step up ring 402 surrounds image sensor 104. Step up ring 402 is ceramic, printed circuit board material, or electrically insulative tape although other electrically insulative materials can be used. A lower, e.g., first, surface 402L of step up ring 402 is attached to upper surface 102U of substrate 102. Traces 110 extend under step up ring 402. Traces 110 are electrically connected to electrically conductive lands 404 on an upper, e.g., second, surface 402U of step up ring 402 by electrically conductive vias 406. Vias 406 extend from lower surface 402L to upper surface 402U of step up ring 402. Interconnection balls 114-1 are formed on lands 404.

To illustrate, trace 110A is electrically connected to a first via 406A of the plurality of vias 406. First via 406A is electrically connected to a first land 404A of the plurality of lands 404. A first interconnection ball 114-1A of the plurality of interconnection balls 114-1 is formed on and electrically connected to first land 404A. The other traces 110, vias 406, lands 404, and interconnection balls 114-1 are electrically connected in a similar fashion so are not discussed further.

Advantageously, use of step up ring 402 allows interconnection balls 114-1 to have minimum size and pitch. This may be important, for example, when a large number of interconnection balls must be provided in a limited area.

Although a particular electrically conductive pathway between bond pads 108 and interconnection balls 114-1 is set forth, in light of this disclosure, those of skill in the art will recognize that other electrically conductive pathways can be formed. For example, step up ring 402 is a multi-layered laminated structure and, instead of straight through vias 406, a plurality of electrically conductive traces on various layers in step up ring 402 are interconnected by a plurality of electrically conductive vias to form the electrical interconnections between traces 110 and lands 404. As another example, interconnection balls 114-1 are distributed in an array format to form a ball grid array type package. Alternatively, interconnection balls 114-1 are not formed resulting in a metal land array type package, e.g., an LGA type package. As a further alternative, flexible conductors similar to flexible conductors 302 of FIG. 3 are used instead of interconnection balls 114-1.

Figure 5:
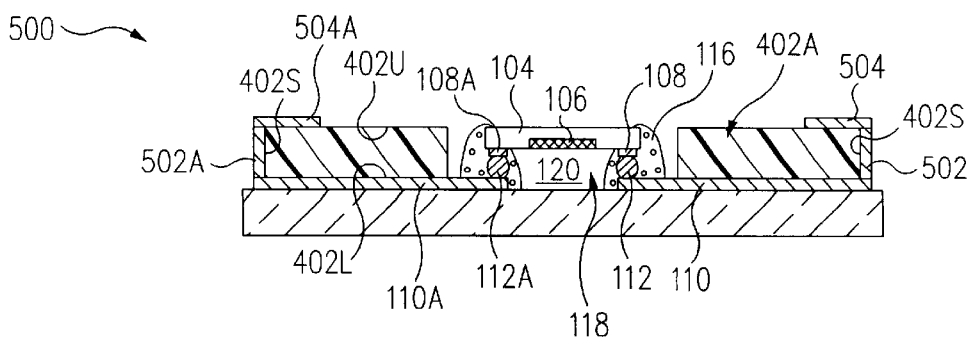
FIG. 5 is a cross-sectional view of an image sensor package in accordance with yet another alternative embodiment.

In another embodiment, instead of vias 406, electrically conductive traces are formed along outer sides 402S of step up ring 402 which extend between lower surface 402L and upper surface 402U of step up ring 402. FIG. 5 is a cross-sectional view of an image sensor package 500 in accordance with this alternative embodiment.

Referring to FIG. 5, traces 110 extend to outer sides 402S of a step up ring 402A. Outer traces 502 extend along outer sides 402S from lower surface 402L to upper surface 402U of step up ring 402A. Outer traces 502 are electrically connected to electrically conductive pads 504, sometimes called lands, on upper surface 402U of step up ring 402A. Pads 504 are typically arrange directly adjacent sides 402S to form a leadless chip carrier (LCC) style footprint.

To illustrate, first trace 110A is electrically connected to a first outer trace 502A of the plurality of outer traces 502. First outer trace 502A is electrically connected to a first pad 504A of the plurality of pads 504. The other traces 110, outer traces 502, and pads 504 are similarly connected so are not discussed further.

Figure 6:
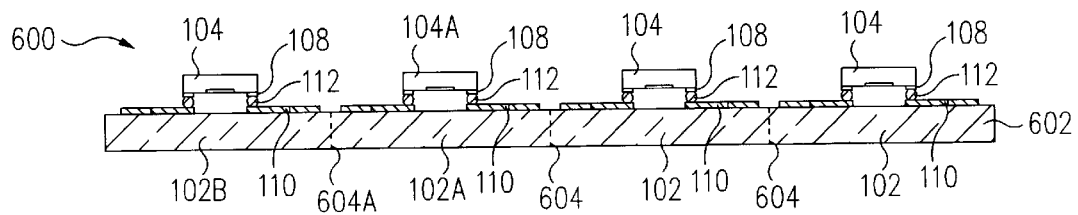
FIG. 6 is a cross-sectional view of an array of image sensor packages during assembly in accordance with the present invention.

Referring again to FIGS. 1 and 2, in one embodiment, package 100 is fabricated simultaneously with a plurality of packages 100 to minimize the cost associated with each individual package 100. FIG. 6 is a cross-sectional view of an array 600 of image sensor packages 100 during assembly in accordance with this embodiment of the present invention.

Referring to FIG. 6, array 600 includes a substrate 602. Substrate 602 includes a plurality of individual substrates 102 integrally connected together in an array format. For example, substrate 602 includes a 4×4 array of substrates 102 integrally connected together for a total of sixteen substrates 102, although it is understood that other array formats and number of substrates 102 can be used.

Each of substrates 102 is delineated by a singulation street 604, which is located between adjacent substrates 102. For example, a first singulation street 604A of the plurality of singulation streets 604 delineates a first substrate 102A of the plurality of substrates 102 from a second substrate 102B of the plurality of substrates 102. The other substrates 102 are similarly delineated from adjacent substrates 102 by corresponding singulation streets 604.

As shown in FIG. 6, image sensors 104 are attached to substrate 602. For example, a first image sensor 104A of the plurality of image sensors 104 is attached to first substrate 102A. The other image sensors 104 are attached to corresponding substrates 102 in a similar manner.

Preferably, image sensors 104 are ground down, sometimes called back lapped, to minimize the thickness of image sensors 104 before image sensors 104 are attached to substrate 602.

Each image sensor 104 is aligned with substrate 602 using any one of a number of conventional alignment techniques, e.g., image sensors 104 are optically or mechanically aligned, and attached to substrate 602. Image sensors 104 are attached to substrate 602 using any one of a number of techniques. For example, solder bumps 112 are formed on bond pads 108 of image sensors 104 or alternatively, on traces 110, and solder bumps 112 are reflowed to attach bond pads 108 to traces 110. Alternatively, bond pads 108 of image sensors 104 are attached to traces 110 by bumps 112 formed of electrically conductive epoxy paste or film, which is thermally or optically cured. As a further alternative, bond pads 108 of image sensors 104 are attached to traces 110 by thermal or thermosonic bonding of gold bumps 112 formed on bond pads 108, or alternatively, on traces 110. In light of this disclosure, those of skill in the art will understand that other methods of attaching image sensors 104 to substrate 602 can be used.

Figure 7:
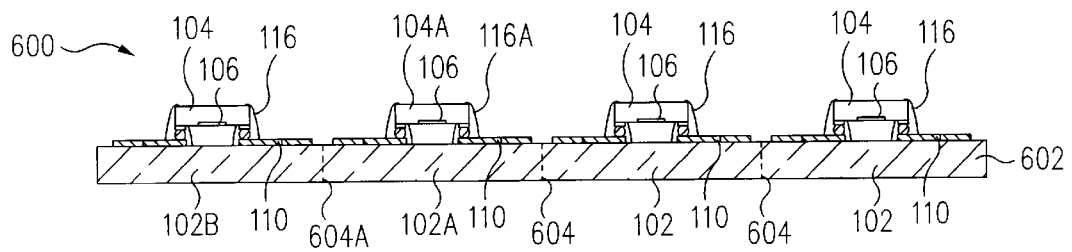
FIG. 7 is a cross-sectional view of the array of FIG. 6 at a later stage of assembly.

FIG. 7 is a cross-sectional view of array 600 of FIG. 6 at a later stage of assembly in accordance with this embodiment of the present invention. As shown in FIG. 7, beads 116 are formed around the peripheries of image sensors 104. To illustrate, a first bead 116A of the plurality of beads 116 is formed around a periphery of first image sensor 104A. The other beads 116 are similarly formed around the peripheries of the other image sensors 104.

Of importance, beads 116 are formed in a manner which prevents beads 116 from completely filling the spaces between image sensors 104 and substrate 602. More particularly, beads 116 do not contact active areas 106 of image sensors 104.

Generally, beads 116 are formed from a limited flow material. For example, an epoxy dispense material such as Hysol 4323 is applied using a needle dispenser and then cured to form beads 116.

Figure 8:
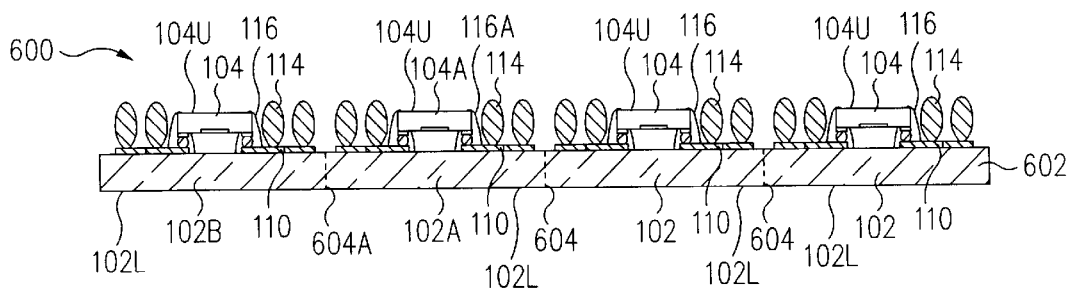
FIG. 8 is a cross-sectional view of the array of FIG. 7 at a later stage of assembly.

FIG. 8 is a cross-sectional view of array 600 of FIG. 7 at a later stage of assembly in accordance with this embodiment of the present invention. As shown in FIG. 8, substrate 602 is populated with interconnection balls 114 on corresponding traces 110.

In one embodiment, each package 100 is marked to identify the part number associated with image sensor package 100. For example, upper surfaces 104U of image sensors 104 or noncritical, e.g., peripheral, areas of lower surfaces 102L of substrates 102 are marked by laser or ink.

In alternative embodiments, instead of forming interconnection balls 114 on corresponding traces 110 as shown in FIG. 8: (1) flexible conductors such as flexible conductors 302 of FIG. 3 are attached to traces 110; (2) step up rings similar to step up ring 402 of FIG. 4 are attached to each substrate 102 and, in one embodiment, populated with interconnection balls similar to interconnection balls 114-1 of FIG. 4; or (3) step up rings similar to step up ring 402A of FIG. 5 are attached to each substrate 102.

Referring still to FIG. 8, array 600 is singulated into a plurality of individual image sensor packages 100 (FIGS. 1, 2) by singulating substrate 602 along singulation streets 604. Singulation can be accomplished using any one of a number of conventional singulation techniques, e.g., by laser cutting or mechanical sawing through substrate 602 along singulation streets 604. Array 600 can also be singulated before interconnection balls 114 are populated, e.g., after the assembly shown in FIG. 7 is completed.

By forming a plurality of packages 100 simultaneously, several advantages are realized. One advantage is that it is less labor intensive to handle and process a plurality of packages 100 simultaneously rather than to handle and process each package 100 on an individual basis. By reducing labor, the cost associated with each package 100 is minimized. However, in light of this disclosure, those of skill in the art will recognize that packages 100 can also be manufactured on an individual basis if desired.

Figure 9:
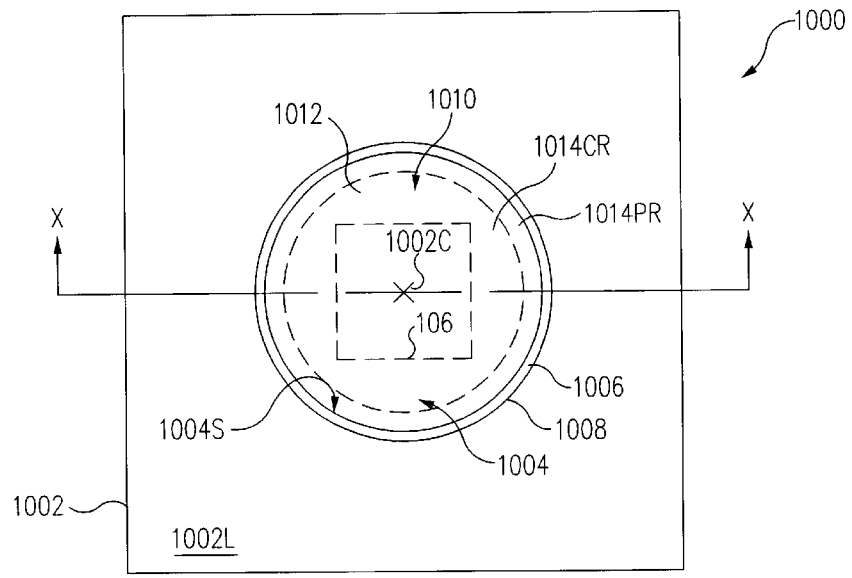
FIG. 9 is a bottom plan view of an image sensor package in accordance with an alternative embodiment of the present invention.
Figure 10:
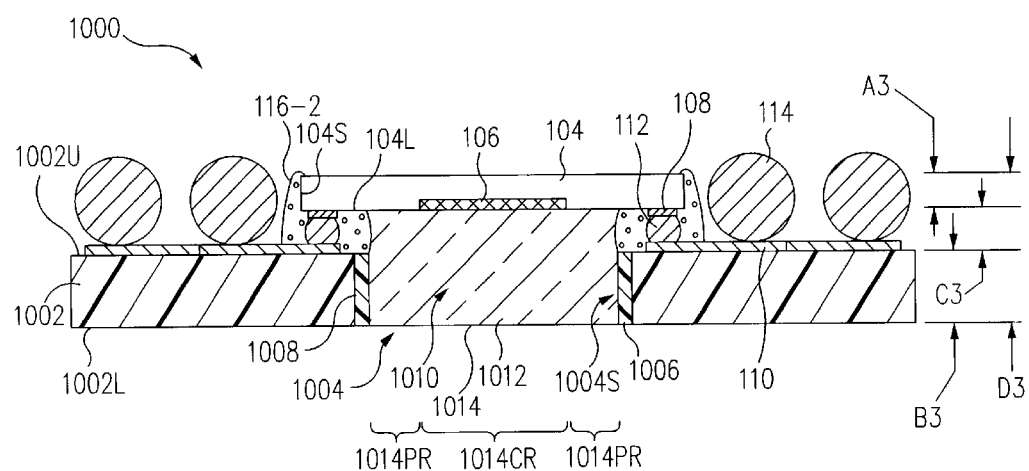
FIG. 10 is a cross-sectional view of the package of FIG. 9 along the line X—X.

FIG. 9 is a bottom plan view of an image sensor package 1000 in accordance with an alternative embodiment of the present invention. FIG. 10 is a cross-sectional view of package 1000 along the line X—X. Package 1000 (FIGS. 9, 10) is similar to package 100 (FIGS. 1, 2) and the discussion with regards to package 100 is incorporated herein. Only the significant differences between packages 100 and 1000 are discussed below.

Referring now to FIGS. 9 and 10 together, package 1000 includes a substrate 1002. In this embodiment, substrate 1002 is opaque to the radiation of interest, e.g., to the radiation which active area 106 of image sensor 104 is responsive or transmits. For example, substrate 1002 is printed circuit board such as BT or FR4, ceramic, metal or polymer tape, although other substrates are used in other embodiments.

Generally, it is desirable that substrate 1002 is a low cost substrate material, and low cost substrate materials are typically opaque. Thus, although an opaque substrate 1002 is discussed herein, in light of this disclosure, it is understood that substrate 1002 does not have to be an opaque material, but can be a transparent material, e.g., optical glass.

Substrate 1002 includes a central aperture 1004, which extends through substrate 1002. More particularly, central aperture 1004 extends from a lower, e.g., first, surface 1002L to an upper, e.g., second, surface 1002U of substrate 1002. As best shown in FIG. 9, central aperture 1004 is circular in shape when viewed from below, e.g., when viewed from a first direction along a line perpendicular to lower surface 1002L, although in other embodiments, central aperture 1004 has other shapes.

Generally, central aperture 1004 is aligned with active area 106 of image sensor 104, i.e., active area 106 is exposed through central aperture 1004. In other words, when viewed from below, active area 106 is superimposed within the area of central aperture 1004, as shown in FIG. 9.

In this embodiment, central aperture 1004 is at, or near, a center 1002C of substrate 1002. However, in other embodiments, central aperture 1004 is offset from center 1002C of substrate 1002.

Central aperture 1004 is defined by an aperture side 1004S, which extends from lower surface 1002L to upper surface 1002U of substrate 1002. In one embodiment, substrate 1002 is printed circuit board. In accordance with this embodiment, aperture side 1004S includes an edge coating 1006, which lines a ring-like interior surface 1008 of substrate 1002. Interior surface 1008 extends from lower surface 1002L to upper surface 1002U of substrate 1002. Edge coating 1006 prevents fibers or particles of interior surface 1008 from flaking off and contaminating active area 106 of image sensor 104. See Glenn, U.S. Pat. No. 5,867,368, which is incorporated herein by reference in its entirety, regarding use of edge coatings to prevent substrate particle generation.

Although aperture side 1004S includes an edge coating 1006, in light of this disclosure, those of skill in the art will understand that edge coating 1006 is optional and that aperture side 1004S and interior surface 1008 can be one and the same. Generally, it is desirable to have edge coating 1006 when substrate 1002 is a material which has a tendency to generate particulates, e.g., is printed circuit board. However, when substrate 1002 is a material which does not have a tendency to generate particulates, e.g., is ceramic or tape, edge coating 1006 is unnecessary.

In this embodiment, bead 116-2 extends between lower surface 104L of image sensor 104 and upper surface 1002U of substrate 1002. Further, bead 116-2 extends inwards towards active area 106 from sides 104S of image sensor 104 to aperture side 1004S. Of importance, bead 116-2 is aligned with aperture side 1004S and bead 116-2 does not contact active area 106.

Lower surface 104L of image sensor 104, bead 116-2, and aperture side 1004S define a pocket 1010. A window 1012 is in pocket 1010 and fills pocket 1010. More particularly, window 1012 directly contacts aperture side 1004S, bead 116-2 and lower surface 104L of image sensor 104 including active area 106.

Window 1012 has an exterior surface 1014, which is exposed to the ambient environment. Exterior surface 1014 is meniscus shaped. Exterior surface 1014 includes a central region 1014CR and a peripheral region 1014PR, which surrounds central region 1014CR. Peripheral region 1014PR defines the periphery of exterior surface 1014, i.e., the region of exterior surface 1014 adjacent to aperture side 1004S. In one embodiment, peripheral region 1014PR extends inwards from aperture side 1004S approximately 0.010 inches (0.25 mm).

In this embodiment, central region 1014CR is substantially planar, i.e., lies in a common plane. Further, central region 1014CR is parallel to a plane defined by lower surface 104L of image sensor 104, and more particularly, to a plane defined by active area 106. In contrast, peripheral region 1014PR is curved and is not planar.

Of importance, active area 106 of image sensor 104 is aligned where central region 1014CR, i.e., active area 106 is exposed through central region 1014CR. In other words, when viewed from below along a line perpendicular to lower surface 1002L, active area 106 is superimposed within the area of central region 1014CR, as shown in FIG. 9.

Generally, window 1012 is transparent to the radiation of interest, e.g., to the radiation which active area 106 of image sensor 104 is responsive or transmits, as those of skill in the art will understand. During use, radiation is directed at package 1000. This radiation strikes exterior surface 1014 of window 1012, passes through window 1012, and strikes active area 106. Of importance, only the radiation which passes through central region 1014CR of exterior surface 1014 strikes active area 106. Stated another way, radiation which passes through peripheral region 1014PR of exterior surface 1014 does not strike active area 106 to any appreciable extent.

Since central region 1014CR of exterior surface 1014 of window 1012 is planar and parallel with a plane defined by active area 106 of image sensor 104, radiation striking active area 106 is undistorted by window 1012. Although a meniscus shaped exterior surface 1014 is described above, in light of this disclosure, it is understood that exterior surface 1014 can have other shapes, e.g., can be planar.

Generally, the transmittance of window 1012 is sufficient to allow the necessary minimum amount the radiation needed for the proper operation of image sensor 104 to pass through window 1012. For example, if the radiation of interest is visible light, window 1012 should have a low refractive index so that window 1012 will not reduce the effectiveness of detector cells such as color or $\mu$-lens fitted detector cells within active area 106. Further, window 1012 should be free from physical defects, which may cause point defects in a received spatial light pattern. Advantageously, by forming window 1012 with a low refractive index, the sensitivity of package 1000 is improved compared to the prior art.

Recall that in the prior art, a housing was mounted around the image sensor and to the print circuit board. This housing supported a window above the image sensor. However, located between the window and the image sensor was air. Disadvantageously, air has a relatively low refractive index compared to the window. As those skilled in the art understand, as visible light or other electromagnetic radiation passes from a material having a high refractive index to a material having a low refractive index and vice versa, a significant percentage of the electromagnetic radiation is reflected.

Since the electromagnetic radiation had to pass from air, through the window, and back through air to reach the active area of the image sensor in the prior art, a significant percentage of the electromagnetic radiation was reflected. In particular, the electromagnetic radiation had to pass through three interfaces: (1) the air/window interface; (2) the window/air interface; and (3) the air/active area interface. This resulted in an overall loss of sensitivity of prior art image sensor assemblies.

However, in package 1000, radiation passes from air, through window 1012, and reaches active area 106. Accordingly, the radiation passes through only two interfaces: (1) air/window 1012 interface; and (2) window 1012/active area 106 interface. By minimizing the number of interfaces, the amount of reflected radiation is also minimized. Further, the amount of reflected radiation is further minimized by forming window 1012 with a low refractive index. Accordingly, the amount of reflected radiation is reduced compared to the prior art. This improves the sensitivity of package 1000 compared to prior art image sensor assemblies.

Further, instead of having air between the window and the active area of the image sensor as in the prior art, window 1012 completely fills the region between the ambient environment and active area 106. Advantageously, by eliminating the prior art cavity between the active area and the window, the possibility of moisture condensation within the cavity is also eliminated. Accordingly, package 1000 does not have a dew point.

In contrast, prior art image sensor assemblies had a dew point, i.e., a temperature at which condensation formed within the housing, which enclosed the image sensor and supported the window. Disadvantageously, this limited the temperature range over which the image sensor assembly would satisfactorily perform. Alternatively, the image sensor assembly was fabricated in a low humidity environment to avoid trapping moisture within the housing and was hermetically sealed by the housing to keep out moisture. This added complexity, which increased the cost of the image sensor assembly. Further, in the event that the hermetic seal of the housing failed, the image sensor was damaged or destroyed.

Since package 1000 does not have a dew point, package 1000 operates satisfactorily over a broader range of temperatures than image sensor assemblies of the prior art. Further, since package 1000 is formed without a cavity, there is no possibility that moisture will leak into package 1000. Accordingly, the reliability of package 1000 is greater than that of the prior art.

Window 1012 also relieves stress on bumps 112. In particular, to the extent that image sensor 104 has a different thermal coefficient expansion than substrate 1002, window 1012 in combination with bead 116-2 insures that image sensor 104 does not become dismounted from substrate 1002 as a result of differential thermal expansion between the image sensor 104 and substrate 1002. By minimizing the possibility of failure of bumps 112, window 1012 further insures the reliability of package 1000.

Advantageously, by mounting image sensor 104 to substrate 1002 by connecting bond pads 108 to traces 110 with bumps 1.12, i.e., by mounting image sensor 104 as a flip chip, image sensor 104 is positionally aligned to interconnection balls 114 to within tight tolerance. More particularly, since bond pads 108 are connected to traces 110, image sensor 104 is inherently aligned to traces 110. Further, since interconnection balls 114 are formed on these same traces 110, interconnection balls 114 are inherently aligned to traces 110. As a result, image sensor 104 is precisely aligned to interconnection balls 114. By precisely aligning image sensor 104 to interconnection balls 114, the performance of package 1000 is improved compared to a conventional image sensor assembly in which bond pads were wirebonded to corresponding traces.

Further, package 1000 is relatively thin compared to prior art image sensor assemblies. In particular, by mounting image sensor 104 directly to substrate 1002, and forming window 1012 in aperture 1004 of substrate 1002, the resulting thickness of package 1000 is relatively small compared to the prior art. Accordingly, package 1000 is well suited for use with miniature lightweight electronic devices, which require thin and lightweight image sensor assemblies.

Illustrative specifications for the various characteristics illustrated in FIG. 10 for package 1000 are set forth below in Table 3.

TABLE 3

| Characteristic | Description | Specification |
| --- | --- | --- |
| A3 | image sensor thickness | 0.18 (or less) to 0.81 mm |
| B3 | substrate thickness | 0.25 (or less) to 1.01 mm |
| C3 | Bump thickness | 0.08 to 0.13 mm, e.g., 0.10 mm |
| D3 | overall thickness of mounted image sensor and substrate | 0.51 (or less) to 1.95 mm |

In this embodiment, window 1012 is a hardened, e.g., cured, liquid encapsulant. Examples of suitable liquid encapsulants include Hysol 7700, 4323.

Advantageously, package 1000 is fabricated using a liquid encapsulant as window 1012, and liquid encapsulants are low cost compared to conventional image sensor package windows such as borosilicate glass windows. Further, package 1000 can be fabricated using a low cost substrate such as a printed circuit board as substrate 1002. Accordingly, package 1000 is fabricated at a lower cost than a conventional image sensor package.

As shown in FIG. 10, formed on upper surface 1002U of substrate 1002 are traces 110. Image sensor 104 including bond pads 108, bumps 112, traces 110, and interconnection balls 114 of package 1000 are substantially similar, or the same, as image sensor 104 including bond pads 108, bumps 112, traces 110, and interconnection balls 114 of package 100 (FIGS. 1, 2), the discussion of which is herein incorporated.

Referring still to FIGS. 9 and 10, substrate 1002 is an electrical insulator or includes an electrically insulating layer on upper surface 1002U. Generally, traces 110 have excellent adhesion to substrate 1002 and do not react with, corrode, or otherwise degrade substrate 1002. Formed on and electrically connected to traces 110 are corresponding interconnection balls 114.

In alternative embodiments, instead of forming interconnection balls 114 on corresponding traces 110 as shown in FIG. 10: (1) flexible conductors such as flexible conductors 302 of FIG. 3 are attached to traces 110; (2) a step up ring similar to step up ring 402 of FIG. 4 is attached to upper surface 1002U of substrate 1002 and, in one embodiment, populated with interconnection balls similar to interconnection balls 114-1 of FIG. 4; or (3) a step up ring similar to step up ring 402A of FIG. 5 is attached to upper surface 1002U of substrate 1002. In yet another alternative embodiment, instead of forming interconnection balls 114 on corresponding traces 110 as shown in FIG. 10, electrically conductive interconnection pads are formed on corresponding traces 110 to form a land grid array (LGA) style package as those of skill in the art will understand.

Figure 11:
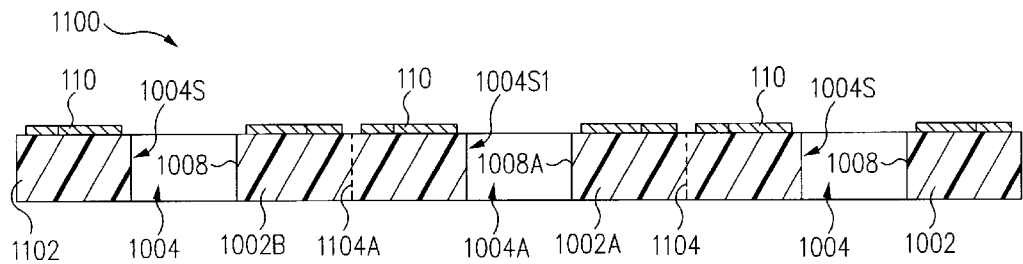
FIG. 11 is a cross-sectional view of an array of image sensor packages during assembly in accordance with another embodiment of the present invention.

In one embodiment, package 1000 is fabricated simultaneously with a plurality of packages 1000 to minimize the cost associated with each individual package 1000. FIG. 11 is a cross-sectional view of an array 1100 of packages 1000 during assembly in accordance with this embodiment of the present invention.

Referring to FIG. 11, array 1100 includes a substrate 1102. Substrate 1102 includes a plurality of individual substrates 1002 integrally connected together in an array format. For example, substrate 1102 includes a 3×3 array of substrates 1002 integrally connected together for a total of nine substrates 1002, although it is understood that other array formats and number of substrates 1002 can be used.

Each of substrates 1002 is delineated by a singulation street 1104, which is located between adjacent substrates 1002. For example, a first singulation street 1104A of the plurality of singulation streets 1104 delineates a first substrate 1002A of the plurality of substrates 1002 from a second substrate 1002B of the plurality of substrates 1002. The other substrates 1002 are similarly delineated from adjacent substrates 1002 by corresponding singulation streets 1004.

As shown in FIG. 11, apertures 1004 are formed in substrate 1102. More particularly, apertures 1004 are formed in substrates 1002. For example, a first aperture 1004A of the plurality of apertures 1004 is formed in first substrate 1002A. The other apertures 1004 are formed in corresponding substrates 1002 in a similar manner. Apertures 1004 are formed using any one of a number of conventional techniques, for example, by lasering, mechanically drilling, or punching.

Apertures 1004 are defined by aperture sides 1004S. At this stage in fabrication, aperture sides 1004S are ring-like interior surfaces 1008 of substrates 1002. To illustrate, a first interior surface 1008A of the plurality of interior surfaces 1008 forms a first aperture side 1004S1 of the plurality of aperture sides 1004S. Aperture side 1004S1 defines first aperture 1004A. The other interior surfaces 1008 form corresponding aperture sides 1004S in a similar manner.

Figure 12:
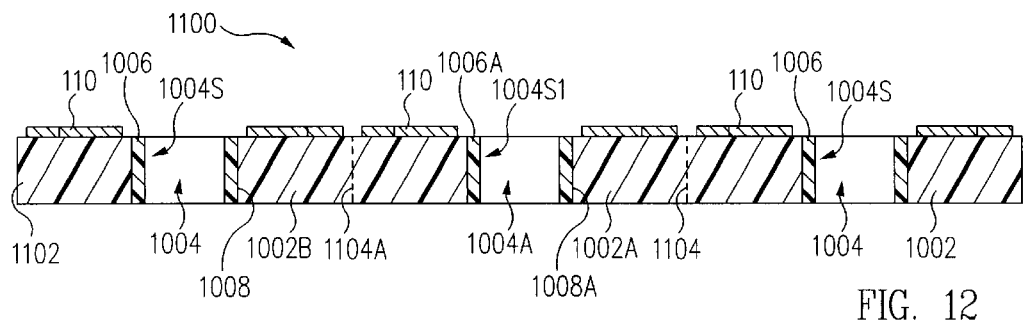
FIG. 12 is a cross-sectional view of the array of FIG. 11 at a later stage of fabrication.

FIG. 12 is a cross-sectional view of array 1100 at a later stage of fabrication in accordance with this embodiment of the present invention. As shown in FIG. 12, edge coatings 1006 are formed to line aperture sides 1004S of apertures 1004. For example, a first edge coating 1006A of the plurality of edge coatings 1006 is formed to line aperture side 1004S1 of first aperture 1004A. The other edge coatings 1006 are formed to line corresponding aperture sides 1004S in a similar manner.

In one embodiment, edge coatings 1006 are formed by applying epoxy to interior surfaces 1008 of substrates 1002, and curing the epoxy. Examples of suitable epoxies include Hysol 4323, 4450, 4451, 7700. For example, edge coating 1006A is formed on interior surface 1008A. The other edge coatings 1006 are formed on corresponding inner surfaces 1008 in a similar manner.

Generally, edge coatings 1006 are formed when substrate 1102 is a material which has a tendency to generate particulates, e.g., is printed circuit board. However, formation of edge coatings 1006, i.e., the operation of FIG. 12, is optional. Accordingly, although edge coatings 1006 are illustrated in FIGS. 13, 14A, 14B, 14C, 14D and 15, in light of this disclosure, it is understood that fabrication can proceed directly from the operation of FIG. 11 to the operation of FIG. 13.

Figure 13:
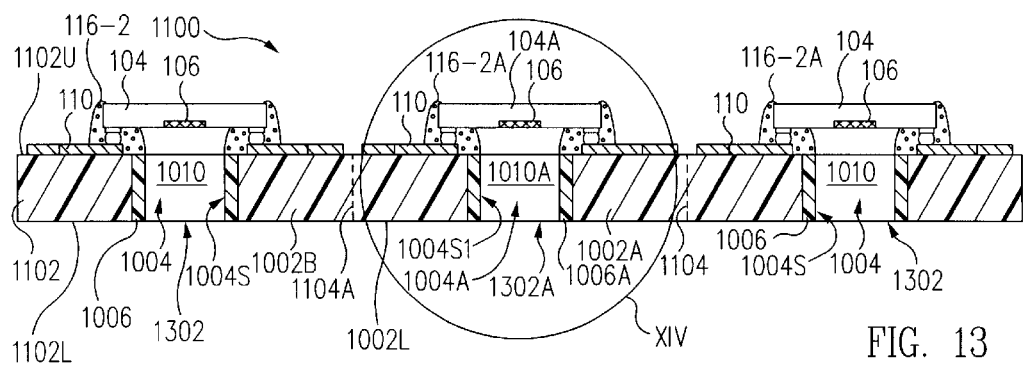
FIG. 13 is a cross-sectional view of the array of FIG. 12 at a later stage of fabrication.

FIG. 13 is a cross-sectional view of array 1100 at a later stage of fabrication in accordance with this embodiment of the present invention. As shown in FIG. 13, image sensors 104 are attached to an upper, e.g., first, surface 1102U of substrate 1102, and more particularly, to traces 110 on upper surfaces 1002U of substrates 1002. Further, image sensors 104 are mounted such that active areas 106 of image sensors 104 are aligned with central apertures 1004. To illustrate, a first image sensor 104A the plurality of image sensors 104 is mounted to substrate 1002A. Active area 106 of image sensor 104A is aligned with central aperture 1004A. Image sensors 104 are attached to substrate 1102 in a manner similar to that discussed in relation to FIG. 6, and so will not be discussed further to avoid detracting from the principals of the invention.

Beads 116-2 are formed around the peripheries of image sensors 104. To illustrate, a first bead 116-2A of the plurality of beads 116-2 is formed around a periphery of image sensor 104A.

To form bead 116-2A, a conventional underfill material such as Hysol 4323, 4451 is applied around image sensor 104A using a needle dispenser. Capillary force draws the underfill material inwards between image sensor 104A and substrate 1002A towards active area 106 of image sensor 104A. However, upon reaching aperture 1004A, and more particularly, aperture side 1004S1 of aperture 1004A, the capillary force is dissipated. Accordingly, the underfill material, and hence bead 116-2A, is drawn inwards only up to aperture side 1004S1. Bead 116-2A is then cured, e.g., with heat. The other beads 116-2 are formed around the peripheries of the other image sensors 104 in a similar manner.

Advantageously, image sensors 104, beads 116-2, and aperture sides 1004S define pockets 1010. To illustrate, a first pocket 1010A of the plurality of pockets 1010 is defined by image sensor 104A, bead 116-2A, and aperture side 1004S1 of aperture 1004A.

Pockets 1010 have openings 1302 at a lower, e.g., second, surface 1102L of substrate 1102. To illustrate, a first opening 130A of pocket 1010A is at lower surface 1002L of substrate 1002A. Pockets 1010 are filled through openings 1302 with a transparent liquid encapsulant as discussed in greater detail below with reference to FIGS. 14A, 14B, 14C, and 14D.

Figure 14A:
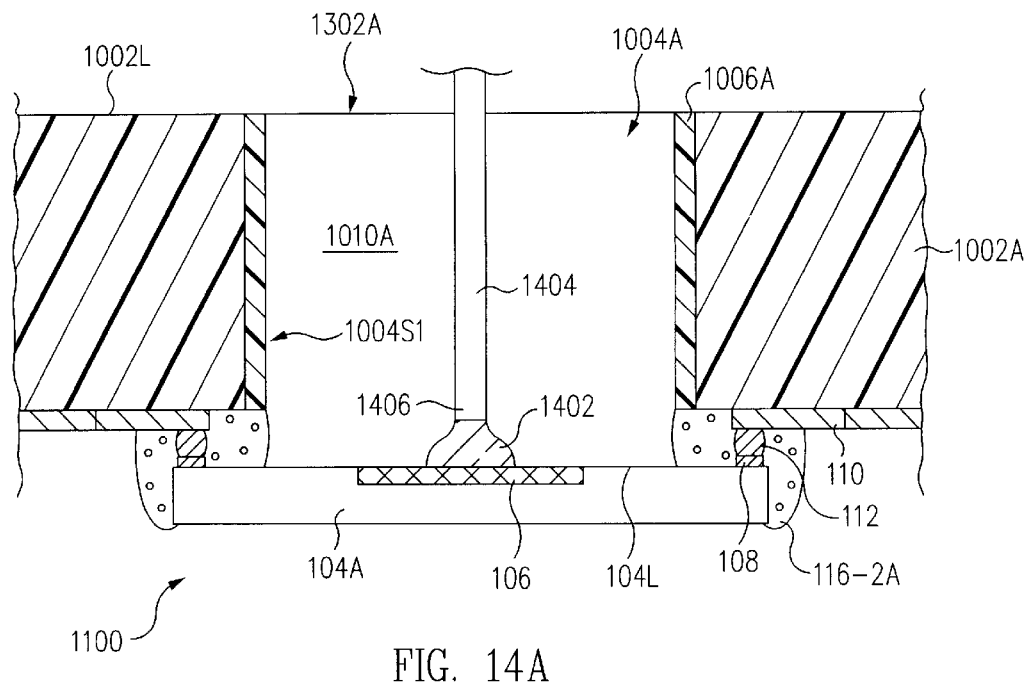
FIGS. 14A, 14B, 14C and 14D are enlarged cross-sectional views of a region XIV of the array of FIG. 13 illustrating filling of a pocket with a transparent liquid encapsulant.

FIGS. 14A, 14B 14C and 14D are enlarged cross-sectional views of a region XIV of array 1100 of FIG. 13 illustrating filling of pocket 1010A with a transparent liquid encapsulant 1402 in accordance with this embodiment of the present invention. Referring to FIG. 14A, assembly 1100 is inverted from the view of FIG. 13 such that opening 1302A of pocket 1010A face upwards.

Of importance, pocket 1010A is filled in a manner which avoids bubble entrapment and void formation within encapsulant 1402. To accomplish this, a needle 1404 of a needle dispenser (not shown) is centrally positioned, i.e., is located substantially equidistant from aperture side 1004S1 of aperture 1004A, within pocket 101A. Further, a tip 1406 of needle 1404 is located adjacent image sensor 104A.

Encapsulant 1402 is dispensed from needle 1404. Since needle 1404 is centrally position within pocket 1010A and tip 1406 is located adjacent image sensor 104A, encapsulant 1402 is initially dispensed on surface 104L of image sensor 104A. Encapsulant 1402 flows outwards from needle 1404 towards aperture side 1004S1.

Figure 14B:
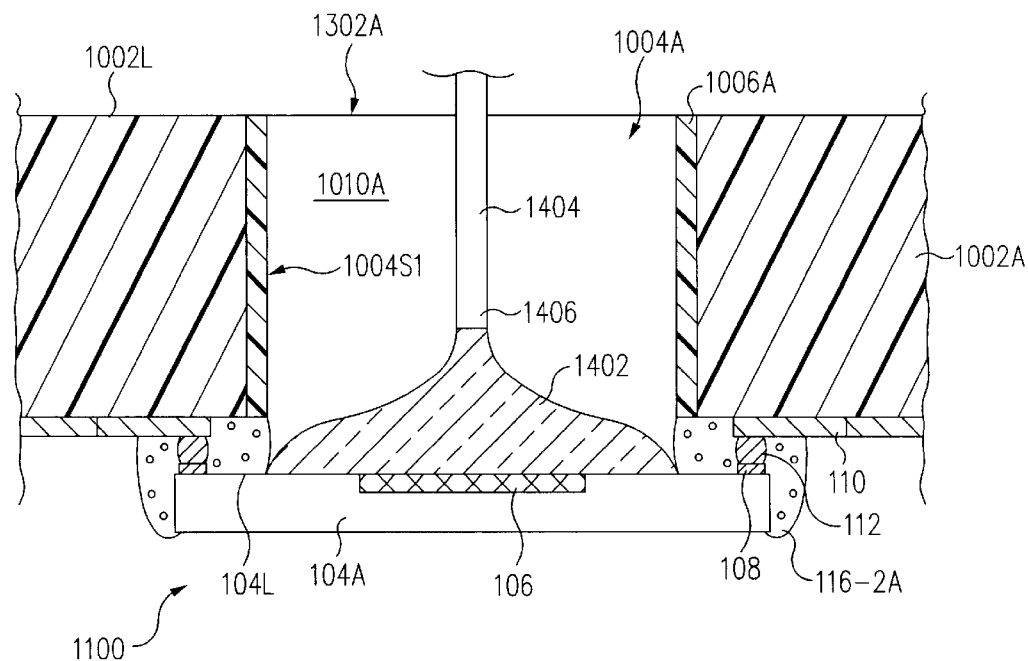

Referring now to FIG. 14B, encapsulant 1402 continues to flow outwards from needle 1404 towards aperture side 1004S1 until encapsulant 1402 contacts bead 116-2A. Of importance, encapsulant 1402 flows outwards in a shape similar to a cone having a base at surface 104L and an apex at needle 1404. In one embodiment, needle 1404 is moved upwards during dispensing of encapsulant 1402 to maintain the cone-like shape of encapsulant 1402.

Dispensing encapsulant 1402 in the above manner ensures that air is displaced by encapsulant 1402 and not trapped within encapsulant 1402. Accordingly, bubble and void formation within encapsulant 1402 is avoided.

Figure 14C:
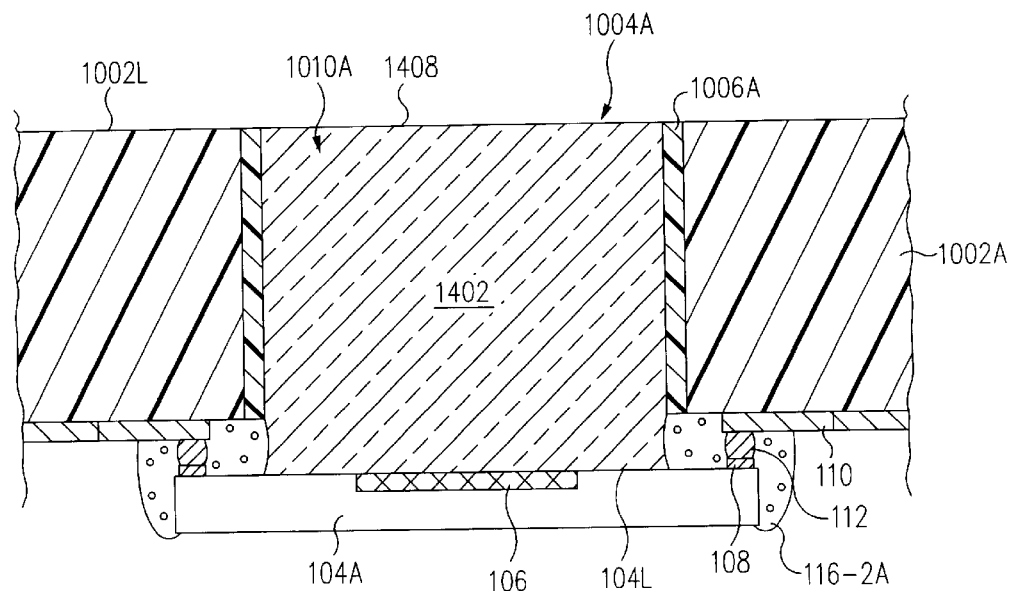

Referring now to FIG. 14C, pocket 1010A is completely filled with encapsulant 1402. An outer surface 1408 of encapsulant 1402 is exposed to the ambient environment. Outer surface 1408 is flush with surface 1002L of substrate 1002A. However, in an alternative embodiment, outer surface 1408 is recessed below surface 1002L of substrate 1002A, i.e., pocket 1010A is only partially filled with encapsulant 1402. In yet another alternative embodiment, encapsulant 1402 overflows pocket 1010A and spills onto surface 1002L of substrate 1002A.

Figure 14D:
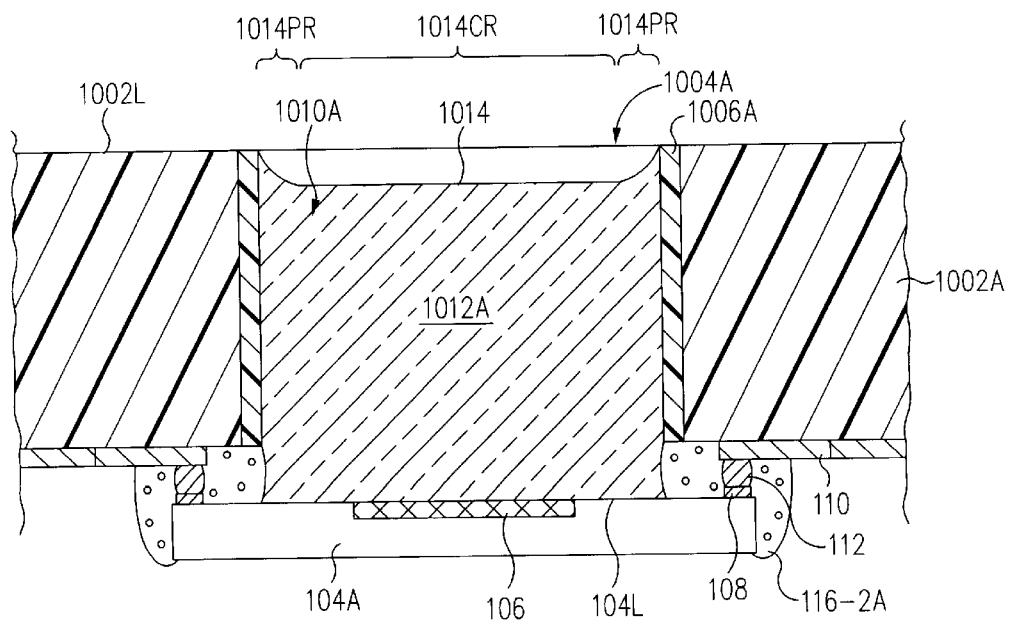

Referring now to FIGS. 14C and 14D together, encapsulant 1402 is cured to form window 1012A, i.e., window 1012A is formed of hardened encapsulant 1402. For example, encapsulant 1402 is cured by heating assembly 1100. As those skilled in the art understand, during curing, liquid encapsulants have a tendency to shrink. Due to this shrinkage, exterior surface 1014 (FIG. 14D) of window 1012A is meniscus shaped. More particularly, central region 1014CR of exterior surface 1014 is substantially planar and peripheral region 1014PR of exterior surface 1014 is curved. For example, central region 1014CR is 0.25 mm below surface 1002L of substrate 1002A.

Of importance, active area 106 of image sensor 104A is aligned with central region 1014CR. To achieve this alignment, aperture 1004A is formed to have a cross-sectional area in a plane parallel to surface 104L of image sensor 104 greater than the area of active area 106. By appropriately sizing aperture 1004A, peripheral region 1014PR of exterior surface 1014 is aligned with noncritical areas of image sensor 104A, i.e., is not aligned with active area 106. In this manner, window 1012A does not distort radiation which strikes active area 106 during use of package 1000.

Illustrative specifications for active area 106 versus aperture 1004A are set forth below in Table 4.

TABLE 4

| image sensor 104A resolution | active area 106 length and width | diameter of aperture 1004A |
| --- | --- | --- |
| Low | 2.5 × 1.5 mm | 3.0 mm |
| Medium | 4 × 3 mm | 4.5 mm |
| High | 10 × 8 mm | 10.5 mm |

The other pockets 1010 are filled with encapsulant 1402 to form the other window 1012 in a manner similar to that discussed above with regards to pocket 1010A and so will not be discussed further to avoid detracting from the principals of the invention. Pockets 1010 are filled simultaneously, i.e., at the same time, with encapsulant 1402. Alternatively, pockets 1010 are filled sequentially, i.e., one at a time, with encapsulant 1402. Further, although use of needle 1404 to dispense encapsulant 1402 is discussed above, in light of this disclosure, those of skill of the art will understand that other methods of dispensing encapsulant 1402 or a similar material can be used.

Figure 15:
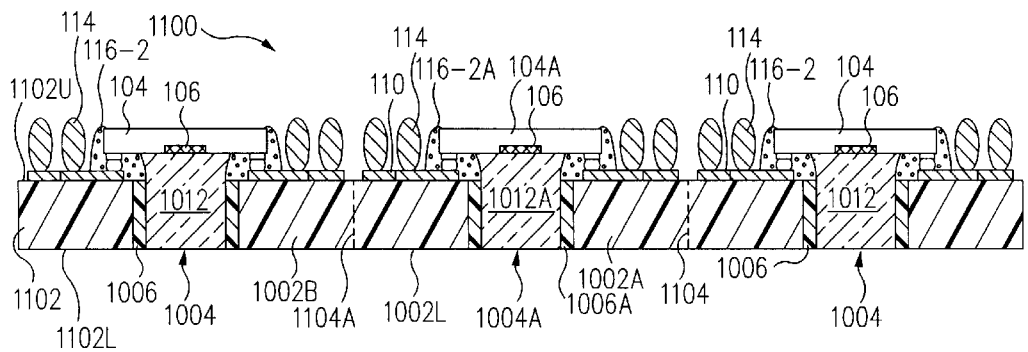
FIG. 15 is a cross-sectional view of the array of FIG. 13 at a later stage of fabrication.

FIG. 15 is a cross-sectional view of array 1100 at a later stage of fabrication in accordance with this embodiment of the present invention. As shown in FIG. 15, substrate 1102 is populated with interconnection balls 114 on corresponding traces 110. In one embodiment, each package 1000 is marked to identify the part number associated with the package 1000.

In alternative embodiments, instead of forming interconnection balls 114 on corresponding traces 110 as shown in FIG. 15: (1) flexible conductors such as flexible conductors 302 of FIG. 3 are attached to traces 110; (2) step up rings similar to step up ring 402 of FIG. 4 are attached to each substrate 1002 and, in one embodiment, populated with interconnection balls similar to interconnection balls 114-1 of FIG. 4; or (3) step up rings similar to step up ring 402A of FIG. 5 are attached to each substrate 1002.

Referring still to FIG. 15, array 1100 is singulated into a plurality of individual image sensor packages 1000 (FIGS. 9, 10) by singulating substrate 1102 along singulation streets 1104. Singulation can be accomplished using any one of a number of conventional singulation techniques, e.g., by laser cutting or mechanical sawing through substrate 1102 along singulation streets 1104. Assembly 1100 can also be singulated before interconnection balls 114 are populated. Although the fabrication of a plurality of packages 1000 simultaneously is discussed above, in light of this disclosure, those of skill in the art will recognize that packages 1000 can also be manufactured on an individual basis, if desired.

This application is related to Glenn et al., commonly assigned U.S. patent application Ser. No. 09/447,202, filed Nov. 22, 1999, entitled "THIN IMAGE SENSOR PACKAGE HAVING TRANSPARENT SUBSTRATE"; and Glenn et al., commonly assigned U.S. patent application Ser. No. 09/448,538, filed Nov. 22, 1999, entitled "THIN IMAGE SENSOR PACKAGE FABRICATION METHOD", now U.S. Pat. No. 6,396,043, issued May 28, 2002, which are all herein incorporated by reference in their entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

We claim:

1. A method comprising:

forming an aperture in a substrate;

mounting an image sensor to said substrate such that an active area of said image sensor is aligned with said aperture;

forming a bead around a periphery of said image sensor, where an aperture side of said aperture, said image sensor, and said bead define a pocket; and filling said pocket with a liquid encapsulant.

2. The method of claim 1 wherein said substrate is one of a plurality of substrates integrally connected together in an array, said method further comprising singulating said array.

3. The method of claim 1 further comprising lining said aperture side with an edge coating.

4. The method of claim 1 wherein said mounting comprises electrically connecting a bond pad of said image sensor to a trace on a surface of said substrate.

5. The method of claim 4 further comprising forming an interconnection ball on said trace.

6. The method of claim 4 further comprising attaching a flexible conductor to said trace.

7. The method of claim 4 further comprising attaching a step up ring to said substrate.

8. The method of claim 7 wherein a first surface of said step up ring is attached to said substrate, said trace being electrically connected to a land on a second surface of said step up ring.

9. The method of claim 8 further comprising forming an interconnection ball on said land.

10. The method of claim 1 wherein said forming a bead comprises applying a material around said image sensor, wherein capillary force draws said material inwards between said image sensor and said substrate towards said active area, said material being drawn inwards up to said aperture side.

11. The method of claim 1 wherein said filling said pocket comprises dispensing said liquid encapsulant on a first surface of said image sensor.

12. The method of claim 11 wherein said liquid encapsulant is dispensed from a needle, said liquid encapsulant being dispensed in a cone-like shape having a base at said first surface of said image sensor and an apex at said needle.

13. The method of claim 12 further comprising moving said needle during said dispensing to maintain said cone-like shape of said liquid encapsulant.

14. The method of claim 1 further comprising curing said liquid encapsulant to form a window.

15. The method of claim 14 wherein said window has an exterior surface exposed to the ambient environment.

16. The method of claim 15 wherein said exterior surface comprises a central region and a peripheral region surrounding said central region, said central region being substantially planar.

17. The method of claim 16 wherein said active area is aligned with said central region.

18. The method of claim 14 wherein said active area is a receiver, transmitter or transceiver of radiation, said window being transparent to said radiation.

19. The method of claim 1 wherein said image sensor is selected from the group consisting of a CMOS image sensor device, a charge coupled device, a pyroelectric ceramic on CMOS device and an erasable programmable read-only memory device.

20. The method of claim 1 wherein said pocket is completely filled during said filling said pocket.

* * * * *